United States Patent
Ward

(10) Patent No.: US 8,322,882 B2
(45) Date of Patent: Dec. 4, 2012

(54) FLEXIBLE DISTRIBUTED LED-BASED LIGHT SOURCE AND METHOD FOR MAKING THE SAME

(75) Inventor: Calvin B. Ward, Castro Valley, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 12/888,196

(22) Filed: Sep. 22, 2010

(65) Prior Publication Data

US 2012/0068622 A1 Mar. 22, 2012

(51) Int. Cl.
*F21V 29/00* (2006.01)
*F21V 15/00* (2006.01)

(52) U.S. Cl. .................. 362/249.02; 362/294; 362/231; 362/249.04

(58) Field of Classification Search ............. 362/249.02, 362/249.04, 231, 800, 294; 257/88, 98; 438/26, 438/122; 422/26, 122
See application file for complete search history.

(56) References Cited

U.S. PATENT DOCUMENTS

| | | | | |
|---|---|---|---|---|
| 6,228,228 B1 * | 5/2001 | Singh et al. | ................. | 204/192.1 |
| 6,936,855 B1 * | 8/2005 | Harrah | ............................. | 257/88 |
| 7,145,179 B2 * | 12/2006 | Petroski | .......................... | 257/81 |
| 7,456,500 B2 * | 11/2008 | Kromotis et al. | ............. | 257/725 |
| 7,504,320 B2 * | 3/2009 | Wang | ............................. | 438/464 |
| 7,642,137 B2 * | 1/2010 | Lin et al. | ......................... | 438/127 |
| 8,018,151 B2 * | 9/2011 | Chung et al. | .................... | 313/506 |
| 8,076,182 B2 * | 12/2011 | Lin et al. | ......................... | 438/118 |
| 2002/0117330 A1 * | 8/2002 | Eldridge et al. | ............... | 174/260 |
| 2009/0273925 A1 * | 11/2009 | Schultz et al. | ............ | 362/249.01 |
| 2010/0302777 A1 * | 12/2010 | Knoll et al. | .................... | 362/235 |

OTHER PUBLICATIONS

International Search Report, PCT/US2011/051591, Apr. 9, 2012.

\* cited by examiner

*Primary Examiner* — Peggy A. Neils
(74) *Attorney, Agent, or Firm* — Calvin B. Ward

(57) ABSTRACT

A precursor structure for fabricating light sources, the light sources fabricated therefrom, and the method of fabricating the precursor structure are disclosed. A precursor substrate includes a flexible printed circuit board on which dies are bonded and a separation ridge. The flexible printed circuit board has a bottom heat-conducting layer, an insulating layer, and a circuit layer. The insulating layer and the circuit layer include a plurality of openings that expose the top surface of the heat-conducting layer. The separation ridge extends above the circuit layer and the dies and is configured to prevent contact with the dies and any structures constructed above the dies when the precursor substrate is in contact with a surface positioned over the die and in contact with the separation ridge. The structure is well suited for roll-to-roll processing equipment.

18 Claims, 5 Drawing Sheets

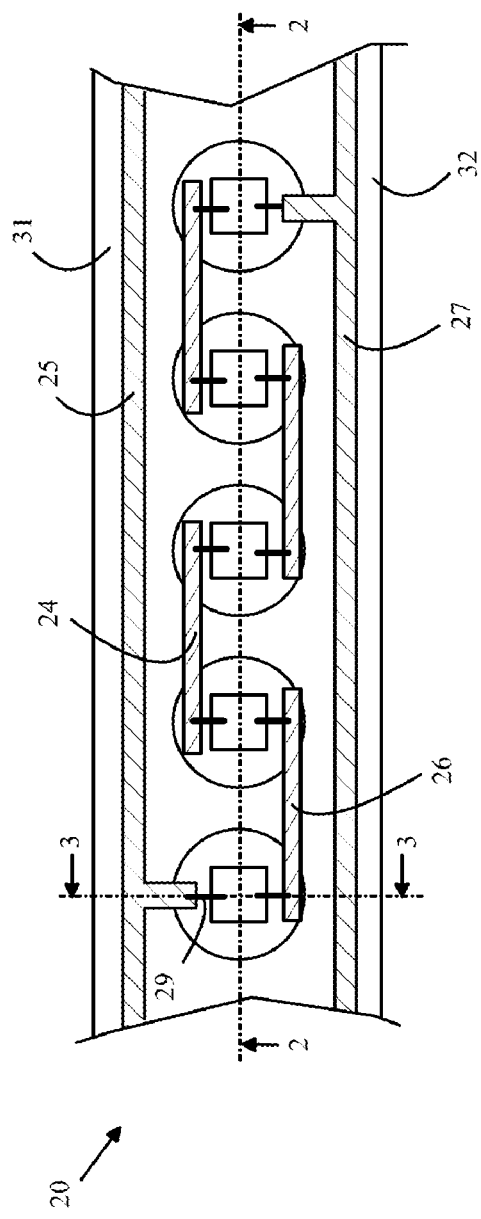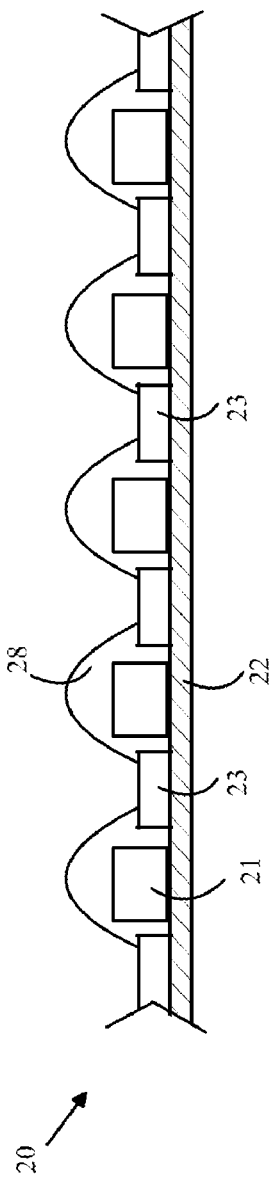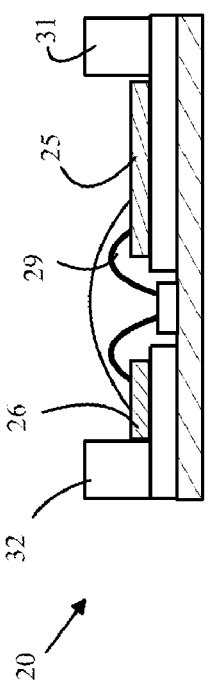

FLEXIBLE DISTRIBUTED LED-BASED LIGHT SOURCE AND METHOD FOR MAKING THE SAME

BACKGROUND OF THE INVENTION

Light emitting diodes (LEDs) are an important class of solid-state devices that convert electric energy to light. Improvements in these devices have resulted in their use in light fixtures designed to replace conventional incandescent and fluorescent light sources. The LEDs have significantly longer lifetimes than both incandescent bulbs and fluorescent tubes. In addition, the efficiency of conversion of electricity to light has now reached the same levels as obtained in fluorescent light fixtures.

LEDs have limited power, and hence a replacement requires a large number of LEDs. If the conventional light source was a point source or a compact source such as a conventional incandescent bulb, a luminaire manufacturer can start from a printed circuit board on which a plurality of dies have already been mounted together with a power supply that converts AC to a constant current source that drives the LEDs. This prefabricated component can be used in a large variety of luminaires that require a source of the same light output and color temperature. In addition, light sources that provide different light outputs that are less than some predetermined maximum light output can be constructed from the same printed circuit board by partially populating the printed circuit board with LEDs.

However, many applications require a distributed light source. Light fixtures for illuminating work areas in commercial office and retail spaces are typically two-dimensional extended sources. The goal of such light sources is to provide a predetermined level of light flux on a work surface under the light fixture while minimizing the brightness of the source such that a user can look directly at the light source without the glare causing discomfort.

In existing lighting systems, this type of extended light source is typically constructed from a plurality of fluorescent tubes in an enclosure that is covered by some form of diffuser. The number and types of tubes vary from light source to light source. Furthermore, for any given tube form factor, there are variety of tubes depending on the desired output light spectrum or color temperature.

Providing LED replacements for such light sources presents a number of challenges. Upgrading existing light sources typically involves replacing the fluorescent tubes with a LED-based source that has the same form factor as the existing fluorescent tubes. The fluorescent tube form factor limits the intensity of the replacement fluorescent tube because of the difficulties in providing sufficient heat dissipation within the form factor of an existing fluorescent tube. Furthermore, multiple LED-based tubes are required for each light fixture to provide a one-for-one replacement with the existing fluorescent tubes. As a result the cost of upgrading an existing light source is still many times the cost of the fluorescent tubes being replaced.

If a single extended LED-based two-dimensional source is used, a large area printed circuit board is needed having an area similar to that of the existing fixture. The fixture requires in excess of 100 dies to be mounted on a large area that requires expensive equipment to pick and place the dies over the area. In addition, each different luminaire requires a different printed circuit board and associated specialized equipment. In addition, the circuit board must provide the heat-dissipation surface, since LEDs are more sensitive to operating at elevated temperatures.

The number of potential linear and two-dimensional source sizes and configurations is potentially very large. Hence, inventorying all the potential sizes poses significant challenges. In principle, some smaller-sized extended light sources that include a plurality of LEDs and that can be used to construct larger light sources could be stocked; however, such an arrangement requires the luminaire manufacturer to provide a substrate for combining a number of such sources and to perform the fabrication work needed to mount the individual light sources on that substrate. This increases the cost and design cycle time to the luminaire manufacturer.

SUMMARY OF THE INVENTION

The present invention includes a precursor structure for fabricating light sources, the light sources fabricated therefrom, and the method of fabricating the precursor structure. A precursor substrate includes a flexible printed circuit board on which dies are bonded and a separation ridge. The flexible printed circuit board has a bottom heat-conducting layer, an insulating layer, and a circuit layer. The insulating layer and the circuit layer include a plurality of openings that expose the top surface of the heat-conducting layer. The circuit layer includes a plurality of electrical conductors. Dies that include LEDs are bonded to the heat-conducting layer in the openings. The separation ridge extends above the circuit layer and the dies and is configured to prevent contact with the dies and any structures constructed above the dies when the precursor substrate is in contact with a surface positioned over the die and in contact with the separation ridge.

In one aspect of the invention, the heat-conducting layer includes a ferromagnetic material.

In another aspect of the invention, the precursor substrate is organized into a plurality of die groups. Each die group includes a plurality of LEDs, each LED being bonded to the top surface of the heat-conducting layer. Each LED is connected to first and second group contacts that power the LED when a potential is applied between the first and second contacts. The circuit layer is patterned such that the precursor substrate can be cut to provide a light source that includes an integer number of the die groups that are powered from first and second light source contacts.

In another aspect of the invention, all of the die groups are identical to one another.

The precursor substrate is adapted for construction using roll-to-roll processing equipment.

BRIEF DESCRIPTION OF THE DRAWINGS

FIG. 1 is a top view of a portion of light source 20 according to one embodiment of the present invention.

FIG. 2 is a cross-sectional view of light source 20 through line 2-2.

FIG. 3 is a cross-sectional view of light source 20 through line 3-3.

DETAILED DESCRIPTION OF PREFERRED EMBODIMENTS

Figure 4:
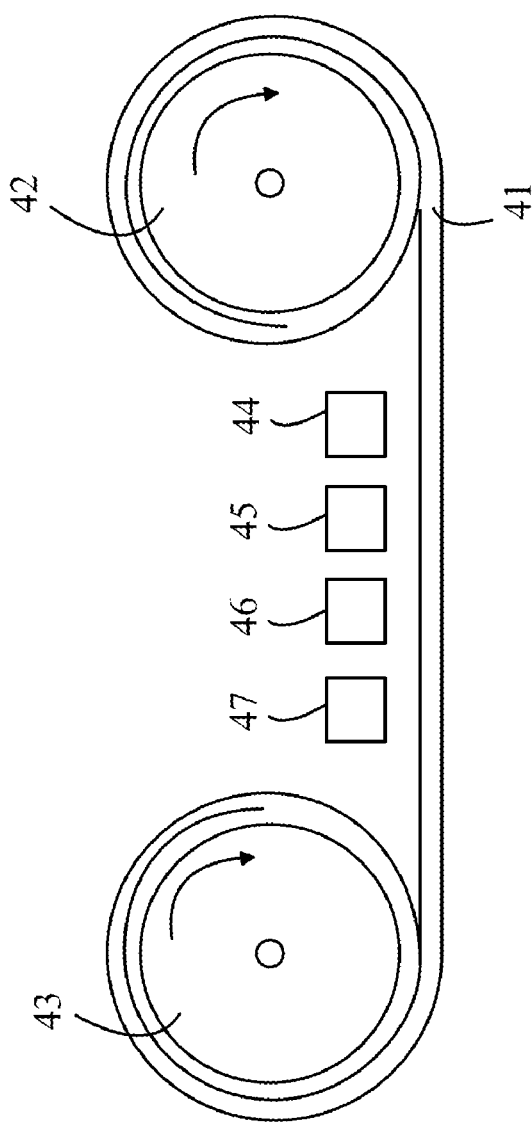
FIG. 4 is a cross-sectional view of one embodiment of a roll-to-roll processing line for constructing a precursor light source according to the present invention.

The manner in which the present invention provides its advantages can be more easily understood with reference to FIGS. 1-3, which illustrate a portion of one embodiment of a distributed light source according to the present invention. FIG. 1 is a top view of a portion of light source 20. FIG. 2 is a cross-sectional view of light source 20 through line 2-2 shown in FIG. 1, and FIG. 3 is a cross-sectional view of light source 20 through line 3-3 shown in FIG. 1. Light source 20 is constructed from a plurality of groups of LEDs of which LED 21 is typical. The LEDs are mounted on layer 22 of a flexible printed circuit board 35 having three layers. The LEDs are mounted in layer 22 through holes in an insulating layer 23. Layer 22 is constructed from a heat-conducting material and serves to move the heat from the LEDs to a heat-dissipating structure to which layer 22 is attached when the light source is used as a component of a luminaire. Layer 22 is typically constructed from a metal. The LEDs are bonded to layer 22 using a heat-conducting adhesive.

A conducting layer is bonded to the top surface of layer 22 and patterned to provide the various electrical traces such as traces 24-27. The LEDs are connected to some of these traces by wire bonds such as wire bond 29 shown in FIGS. 1 and 3.

The insulating layer is constructed from a flexible material such as silicon. The thickness of each of the three layers is chosen such that the light source can be rolled up during manufacture as described below.

The LEDs in light source 20 are grouped into groups of five LEDs that are connected in series. FIGS. 1-3 show one such group. Traces such as traces 24 and 25 provide the series connections. The series connections increase the operating voltage of light source 20. Each group has a voltage drop that is five times the potential needed to drive a single LED. Such an arrangement reduces the size of the conductors needed to transfer power to the LEDs.

Each of the groups is connected in parallel across conductors 25 and 26. The number of groups that are utilized in any particular application can be varied according to the light output that is required in the particular application. As will be explained in more detail below, a continuous light source having many such groupings can be cut after manufacture to provide the desired number of groups for the particular application.

Light source 20 includes ridges 31 and 32 that extend above phosphor layer 28. These ridges protect the LEDs when light source 20 is rolled as described below. In the absence of these ridges, phosphor layer 28 and the underlying wire bonds 29 would be pressed against the bottom surface of layer 32 when light source 20 is rolled. This pressure could damage the LEDs or phosphor layer. In the following discussion, the term "separation ridge" is defined to be a ridge on the flexible printed circuit board that protects the LEDs from damage when the printed circuit board is roiled onto a spindle. The separation ridge prevents the bottom surface of the printed circuit board that is already rolled onto the spindle from contacting the LEDs on the next layer of printed circuit board that is to be rolled onto the spindle. The separation ridge could be part of the insulating layer or a separate layer that is attached to the insulating layer or the top metallic layer.

In the embodiment shown in FIGS. 1-3, each of the LEDs is covered by a layer of phosphor 28 that converts a portion of the light emitted by the underlying LED to light having a different spectrum. For example, a layer of phosphor that converts blue light emitted by the LEDs to yellow light can be utilized to provide a "white" light source. However, this layer is optional. Furthermore, a layer of protective material that lacks the phosphor could be used in place of, or in addition to, layer 28.

As noted above, layer 22 provides a heat-conducting path for removing heat from the LEDs when layer 22 is bonded to a heat-dissipating structure. To provide this function, layer 22 must be amenable to such bonding over a large area. In principle, any good heat-conducting material that can provide the heat-spreading function could be utilized provided the layer is sufficiently thin to allow the light source to be rolled during manufacture. In general, layers of metal or alloys thereof are preferred. For example, copper, iron, nickel, aluminum, or alloys thereof could be utilized.

In one aspect of the present invention, layer 22 includes a ferromagnetic material. The ferromagnetic material allows light source 20 to be bonded to another surface having a ferromagnetic material using magnetic bonding. In such an arrangement, either layer 22 or the surface of the heat-dissipating structure is magnetized sufficiently to bond light source 20 to the heat-dissipating structure. As will be discussed in more detail below, such embodiments are particularly advantageous in retrofitting existing light fixtures or constructing luminaries in which the LEDs are mounted within a steel enclosure.

To simplify the following discussion, the term "LED group" is defined to be a plurality of LEDs that are connected together such that the LEDs are powered from a pair of contacts. All of the LEDs in a group are powered on or off together. The LEDs may be connected in parallel, series, or more complicated connection topologies that provide particular advantages in terms of driving voltages, currents, or fault tolerance.

Term "precursor substrate" is defined to be a plurality of LED groups on a common printed circuit board organized such that light sources having different intensities can be constructed by dividing the common printed circuit board into sections such that each section has an integer number of LED groups. The separated sections provide a light source that can be powered from a pair of contacts. Such a light source can be mounted in a housing to form a luminaire of a desired intensity.

Figure 5:
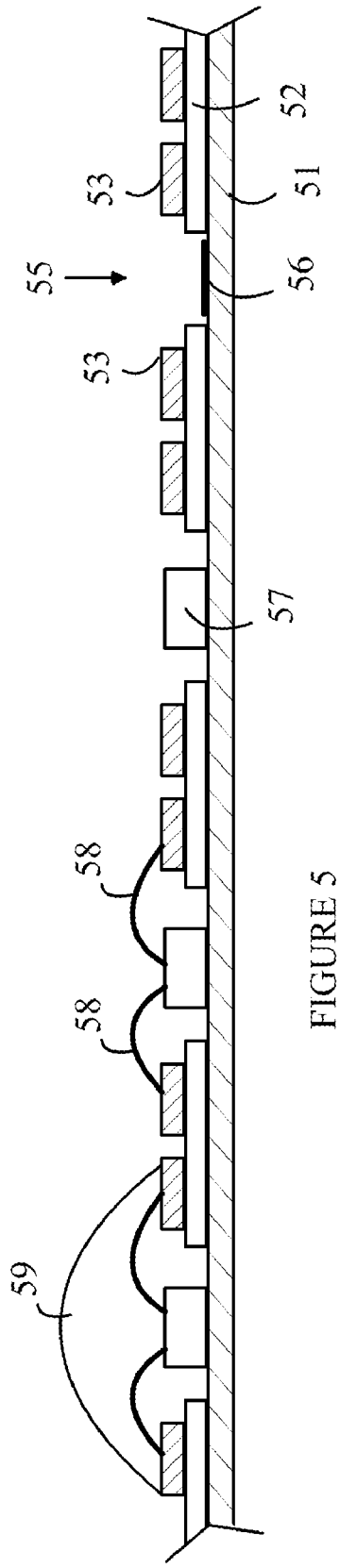
FIG. 5 is a cross-sectional view through a portion of one embodiment of a precursor structure as it passes under the processing stations shown in FIG. 4.

Refer now to FIGS. 4 and 5, which illustrate the manner in which a precursor structure that can be divided into light sources according to the present invention can be fabricated using roll-to-roll processing. FIG. 4 is a cross-sectional view of a roll-to-roll processing line, and FIG. 5 is a cross-sectional view through a portion of the structure as it passes under the processing stations shown in FIG. 4. The precursor structure starts with a flexible printed circuit board 41 that is similar to the flexible printed circuit boards discussed above in that it has flexible layers. The first layer is a heat-conducting layer 51 that is constructed from a metal or combination of metals. Layer 51 could include a number of sub-layers having different metallic compositions. The second layer is a flexible insulating layer 52 on which a metallic circuit layer is deposited and patterned to form circuit connections 53. Insulating layer 52 and the circuit layer include openings 55 through which dies can be deposited onto layer 56. The precursor structure is wound around a spool 42 and fed past a number of processing stations shown at 44-47. After passing under the processing stations, the completed precursor structure is then rolled onto a second spool 43.

Refer now to FIG. 5. When the precursor substrate passes under station 44, a heat-conducting adhesive is applied in the next empty opening 55. As this opening proceeds to a position under station 45, a die 57 having an LED thereon is placed on the adhesive and the heat-conducting adhesive is cured by heat or other suitable means depending on the nature of the adhesive. The attached die proceeds to station 46 where wire bonds 58 are attached to the die and the adjacent circuit traces. Finally, the die moves under station 47, which dispenses a layer of material 59 over the die that protects the wire bonds. Layer 59 could also include phosphors that convert a portion of the light generated by the die to light of a different spectrum to implement a white LED or similar device. After layer 59 is cured, the completed structure proceeds to the spool 43.

It should be noted that the precursor substrate includes ridges such as ridges 31 and 32 shown in FIG. 3 that are not visible in the cross-sectional view shown in FIG. 5. These ridges extend above layer 59 to form a valley that prevents layer 59 from contacting layer 51 on the rolled up precursor on spool 43, and hence, be protected from damage during the roll-up process.

Figure 6:
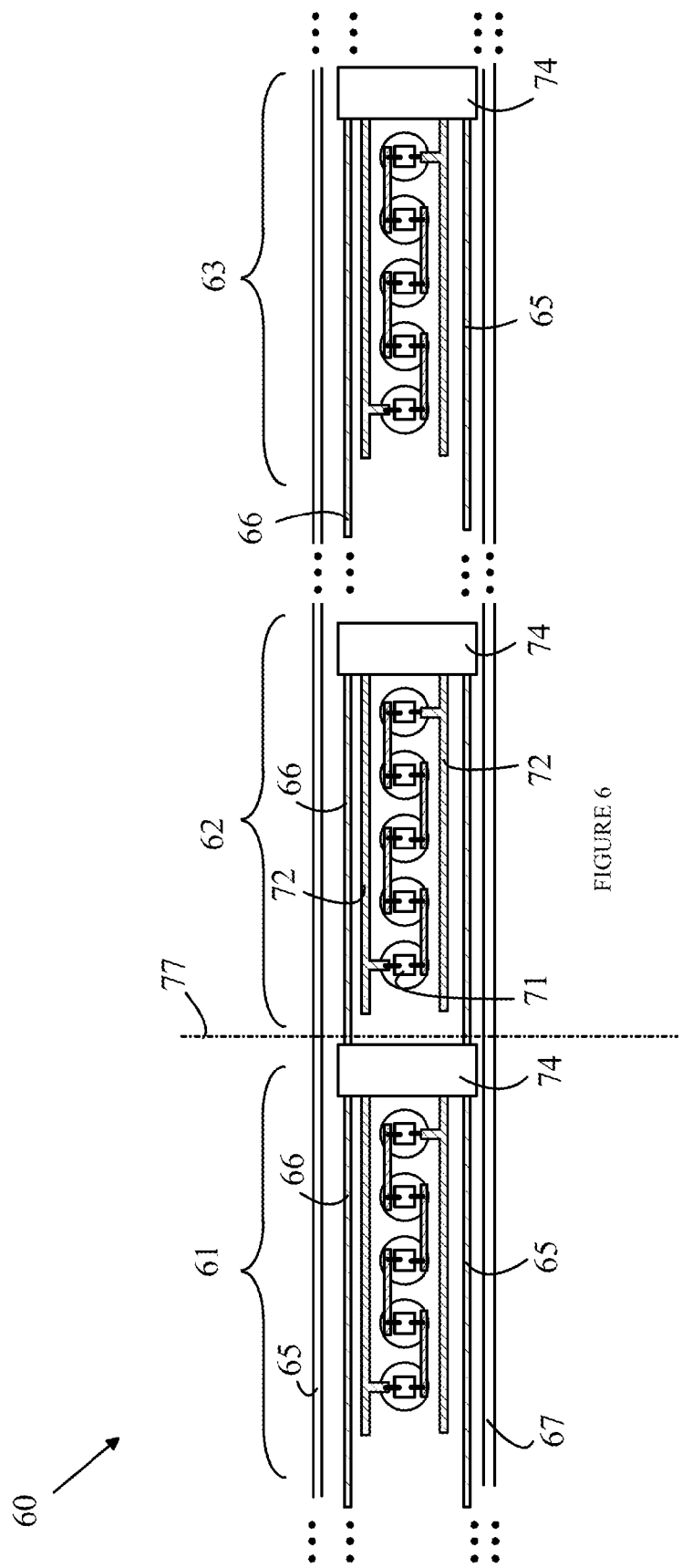
FIG. 6 is a top view of a portion of another embodiment of a precursor substrate that can be divided into individual light sources having different lengths.

Refer now to FIG. 6, which is a top view of a portion of another embodiment of a precursor substrate that can be divided into individual light sources having different lengths. Precursor substrate 60 is constructed from a plurality of LED groups of which LED groups 61-63 are typical. The sections are populated with LEDs and drive circuits in a manner analogous to that discussed above with respect to FIGS. 5 and 6. In the case of precursor substrate 60, an additional processing station that attaches the drive circuits shown at 74 is utilized. The precursor substrate includes separation ridges 67 that protect the dies and circuits when the precursor substrate is rolled up. Each LED group includes a plurality of LEDs 71 that are powered by a group bus 72 that is driven from a drive circuit 74 that is included in the group. In the embodiment shown in FIG. 6, the LEDs within a group are connected in series within each LED group; however, embodiments in which the LEDs are driven in parallel or some other arrangement could also be constructed. A series connection scheme has the advantage of requiring less current carrying capacity from section bus 72. Drive circuit 74 is configured to provide the current needed on group bus 72 to drive the LEDs in that segment. Driving circuit 74 is powered from a continuous bus that includes conductors 65 and 66 and that is sized to provide the maximum current needed to drive the largest light source that will be divided out of precursor substrate 60.

Individual light sources can be divided out of precursor substrate 60 by cutting precursor substrate 60 between two segments as shown at 77. Bus 65 is then powered by connecting the ends of bus 66 to an external power supply that is sized to provide the necessary current for powering the number of segments in the light source. Hence, a single precursor substrate of the present invention can be manufactured and inventoried for use in providing light sources for a number of different luminaries.

Figure 7:
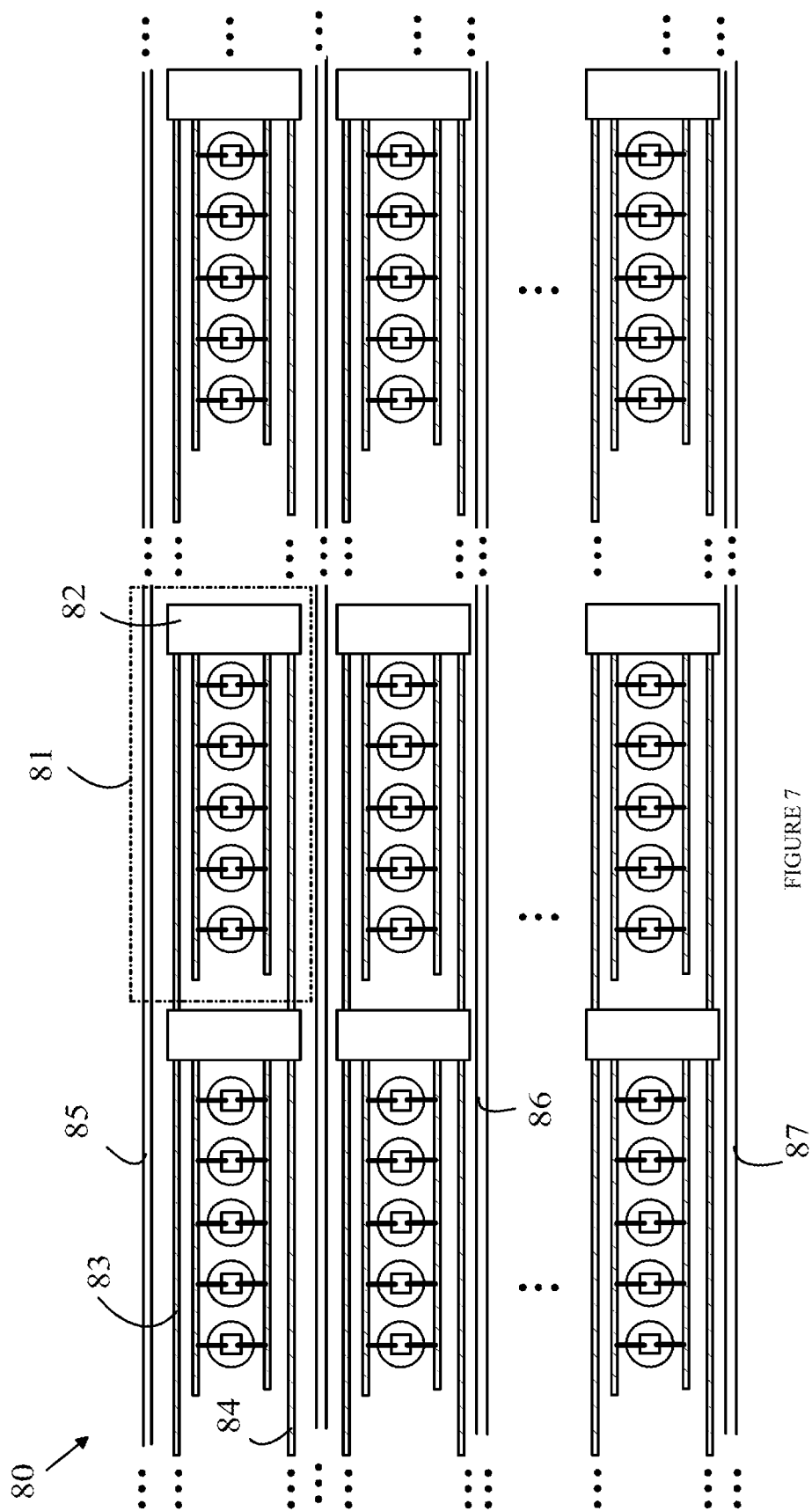
FIG. 7 illustrates another embodiment of a precursor substrate according to the present invention.

The above-described embodiments of the present invention have a precursor substrate that is a one-dimensional distributed light source in that only one row of LED groups is present in each light source. However, two-dimensional embodiments of both the precursor substrate and light sources constructed by dividing the precursor substrate into individual light sources could also be constructed. Refer now to FIG. 7, which illustrates another embodiment of a precursor substrate according to the present invention. Precursor substrate 80 is constructed from a two-dimensional array of LED groups of which LED group 81 is typical. In this embodiment, each LED group includes five LEDs that are connected in parallel to a bus that is powered by a local drive circuit 82. The local drive circuits are powered from a second bus system that includes conductors 83 and 84. Precursor substrate 80 includes a number of separation ridges such as separation ridges 85 and 87 on the outer edges of precursor substrate 80 and internal separation ridges such as separation ridge 86. Precursor substrate 80 can be divided both vertically and/or horizontally to provide light sources that are one-dimensional or two-dimensional in nature.

The light sources of the present invention are adapted for connection to a heat-dissipating structure that transfers the heat generated by the LEDs and other circuitry to the ambient environment. The bottom metallic layer of the printed circuit board facilitates the heat transfer. Since the LEDs are distributed over the area of the light source, the heat is more or less evenly spread over the bottom surface of the light source. This surface is preferably attached to the heat-dissipating structure by an attachment mechanism whose thermal resistance is low to ensure that the bottom surface of the printed circuit board is maintained at a temperature that is consistent with maintaining the temperature of the LEDs within the proper range of temperatures.

As noted above, one method for attaching the light source to the heat-dissipating structure uses magnetic binding. If the bottom layer of the printed circuit board includes a ferromagnetic material, the printed circuit board can be attached to another ferromagnetic surface magnetically. There are three possible configurations for such attachment. In the first, the bottom surface of the printed circuit board is magnetized. This can be accomplished by including a ferromagnetic material in the bottom layer or by attaching a flexible magnetic sheet to the bottom metallic layer. In this regard, it should be noted that inexpensive flexible magnetic sheets are used to reversibly attach signage to metal surfaces such as the doors of automobiles.

In the second configuration, the heat-dissipating structure is magnetized. Heat-dissipating surfaces that include structures such as fins to increase the heat-dissipating surface area can be molded from iron or some other ferromagnetic material and then magnetized.

In the third configuration, a magnetized sheet of magnetic material is introduced between the heat-dissipating structure and the light source. Here, the sheet of magnetic material does not have to be flexible. An iron sheet that has been magnetized could be utilized in this configuration. To reduce the thermal resistance, a thermally-conducting gel could be introduced between the layers in the final luminaire. Such materials do not interfere with magnetic binding.

The bottom surface of the printed circuit board could also be bonded to the final heat-dissipating structure using a thermally-conducting adhesive. Since the surface area between the bottom surface of the light source and the heat-dissipating structure is much larger than the surface area between the dies and the bottom metallic layer of the printed circuit board, a certain level of heat resistance can be tolerated at this boundary. This is particularly true in luminaries that include an enclosure in which the outer surface of the enclosure serves as the heat transfer surface to the surrounding air. For example, consider a conventional fluorescent fixture in the false ceiling of an office. The enclosure is typically constructed from steel and has an outer surface that is in contact with the air in the space between the false ceiling and the top of the room. If the light source is bonded to the upper surface of the enclosure, essentially the entire surface area of the inner top surface can be utilized to transfer the heat from the LEDs to the enclosure. The heat that is so transferred is then dissipated to the air via the outer surface of the enclosure. In this case, a thin layer of a conventional adhesive can be utilized to bond the light source to the enclosure.

Figure 8:
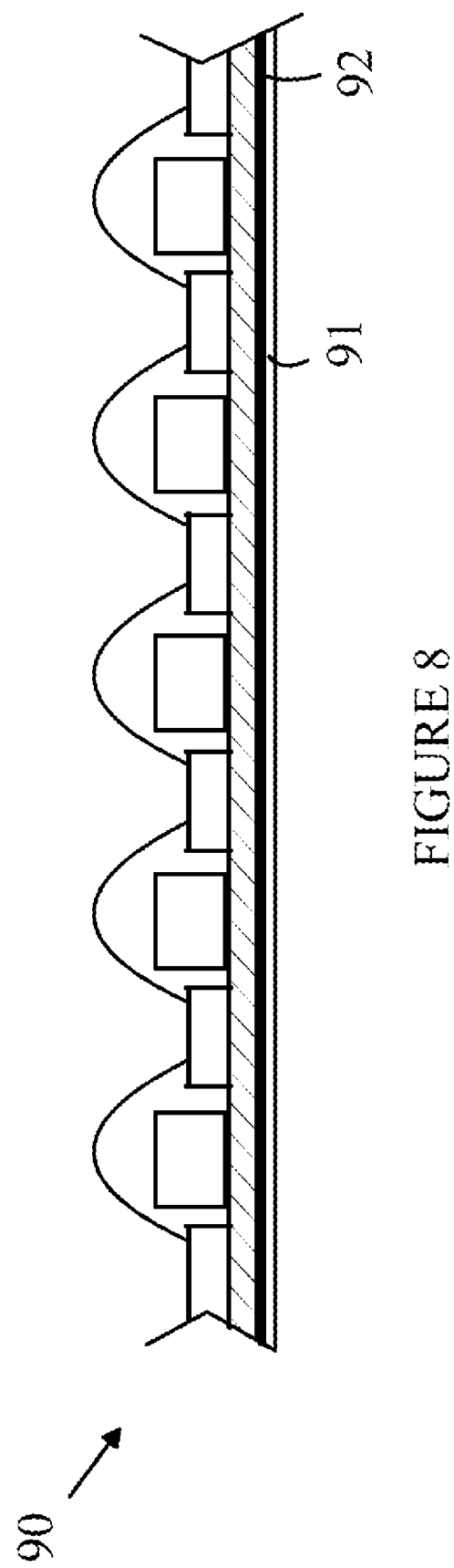
FIG. 8 illustrates an embodiment of a precursor substrate or a light source divided out of a precursor substrate according to another embodiment of the present invention.

Refer now to FIG. 8, which illustrates an embodiment of a precursor substrate or a light source divided out of a precursor substrate according to another embodiment of the present invention. Light source 90 differs from light source 20 shown in FIG. 2 in that a layer 91 of contact adhesive has been applied to the bottom surface of the printed circuit board. Layer 91 is protected by a cover sheet 92 that is peeled off just prior to applying light source 90 to a heat-dissipating structure.

In the above-described embodiments of the present invention, the heat-dissipating layer is electrically isolated from the LEDs, and the LEDs are powered via two separate connections on the top surface of the dies. However, embodiments in which the heat-dissipating layer forms one of the power contacts for the LEDs could also be constructed. If the LEDs in each group are connected in parallel, the heat-dissipating layer could be used as one of the power contacts. The common contact for the LED group can be isolated from the common contact in the other groups by patterning the heat-dissipating layer.

In the above-described embodiments, each group of LEDs is composed of single LEDs; however, each LED in the above-described embodiments could be replaced by a group of LEDs. In the present invention, single LEDs are preferred because this arrangement provides improved uniformity of the heat generation and heat dissipation. If small groups of tightly packed LEDs are used, the local heating is significantly higher, and hence, heat dissipation is more difficult. However, in particular applications light sources having such small groups distributed over the substrate may provide sufficient additional advantages to overcome any additional heat dissipation structures that are needed to accommodate the localized heating.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A precursor substrate comprising:
    a flexible printed circuit board having a bottom heat-conducting layer, an insulating layer, and a circuit layer, said insulating layer and said circuit layer comprising a plurality of openings that expose a top surface of said heat-conducting layer, and said circuit layer comprising a plurality of electrical conductors;
    a plurality of dies bonded to said heat-conducting layer in a corresponding plurality of said openings, each die comprising an LED that is electrically connected to one of said electrical conductors; and
    a separation ridge extending above said circuit layer and said dies,
    wherein said separation ridge is configured such that said precursor substrate can be rolled up in a predetermined direction to form a plurality of coils such that said separation ridge prevents said LEDs and any structures constructed above said LEDs, except said separation ridge, from contacting said bottom heat-conducting layer of said flexible printed circuit board on an adjacent layer in said coil.

2. The precursor substrate of claim 1 further comprising a layer of material over each of said dies, said separation ridge extending above said layer of material.

3. The precursor substrate of claim 2 wherein said LEDs generate light of a first wavelength and wherein said layer of material comprises a phosphor that converts light of said first wavelength to light of a second wavelength different from said first wavelength.

4. The precursor substrate of claim 1 wherein said heat-conducting layer comprises a ferromagnetic material.

5. The precursor substrate of claim 4 wherein said ferromagnetic material is magnetized.

6. The precursor substrate of claim 1 wherein a bottom surface of said heat-conducting layer comprises an adhesive covered by a removable protective sheet.

7. The precursor substrate of claim 1, wherein said plurality of dies are organized into a plurality of die groups, each die group comprising:
    a plurality of LEDs, each LED being bonded to said top surface of said heat-conducting layer, each LED being connected to first and second group contacts that power said LED when a potential is applied between said first and second group contacts, said circuit layer being patterned such that said precursor substrate can be cut to provide a light source comprising an integer number of said die groups that are powered from first and second light source contacts.

8. The precursor substrate of claim 7 wherein each die group comprises a group driving circuit that converts electrical power received on said first and second light source contacts to power that is applied to said first and second group contacts.

9. The precursor substrate of claim 7 wherein said die groups are arranged in a two dimension array of die groups, said two-dimensional array being arranged in a plurality of rows and columns.

10. The precursor substrate of claim 7 wherein all of said die groups are identical to one another.

11. A method for fabricating a light source, said method comprising:
    providing a flexible printed circuit board having a bottom heat-conducting layer, an insulating layer, and a circuit layer, said insulating layer and said circuit layer comprising a plurality of openings that expose a top surface of said heat-conducting layer, and said circuit layer comprising a plurality of electrical conductors;
    bonding a plurality of dies to said heat-conducting layer in a corresponding plurality of said openings, each of said dies comprising an LED;
    connecting each of said dies to one of said electrical conductors;
    providing a separation ridge structure extending above said circuit layer and said dies; and
    rolling up said flexible printed circuit board in a first direction to form a plurality of coils such that said separation ridge prevents said LEDs and any structures constructed above said LEDs, except said separation ridge, from contacting said bottom heat-conducting layer of said flexible printed circuit board on an adjacent layer in said coil.

12. The method of claim 11 further comprising depositing a layer of material over said dies, said separation ridge extending above said layer of material.

13. The method of claim 12 wherein said LEDs generate light of a first wavelength and wherein said layer of material comprises a phosphor that converts light of said first wavelength to light of a second wavelength different from said first wavelength.

14. The method of claim 11 wherein said heat-conducting layer comprises a ferromagnetic material.

15. The method of claim 11 further comprising applying a layer of an adhesive covered by a removable protective sheet to said bottom surface of said heat-conducting layer.

16. The method of claim 11, wherein said dies are organized into a plurality of die groups, each die group comprising:
   a plurality of LEDs, each LED being bonded to said top surface of said heat-conducting layer, each LED being connected to first and second group contacts that power said LED when a potential is applied between said first and second group contacts, said circuit layer being patterned such that said precursor substrate can be cut to provide a light source comprising an integer number of said die groups that are powered from first and second light source contacts.

17. The method of claim 16 further comprising cutting said flexible printed circuit board to provide a light source having an integer number of said die groups and said first and second light source contacts.

18. The precursor substrate of claim 1 wherein said separation ridge comprises first and second linear ridges extending in said predetermined direction, said LEDs being located between said first and second linear ridges.

* * * * *